US012772715B2

(12) United States Patent
Shim et al.

(10) Patent No.: US 12,772,715 B2
(45) Date of Patent: Oct. 20, 2026

(54) DISPLAY DEVICE

(71) Applicant: Samsung Display Co., Ltd., Yongin-Si (KR)

(72) Inventors: Yi Seop Shim, Yongin-si (KR); Yun Hee Park, Yongin-si (KR); Hyun Seung Lee, Yongin-si (KR); Hye Lim Jang, Yongin-si (KR); Kyu Won Cho, Yongin-si (KR); Kyung Seon Tak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/383,900

(22) Filed: Oct. 26, 2023

(65) Prior Publication Data

US 2024/0389440 A1 Nov. 21, 2024

(30) Foreign Application Priority Data

May 19, 2023 (KR) ........................ 10-2023-0065243

(51) Int. Cl.
*H10K 59/80* (2023.01)
*H10K 59/38* (2023.01)
*H10K 59/40* (2023.01)

(52) U.S. Cl.
CPC ......... *H10K 59/8792* (2023.02); *H10K 59/38* (2023.02); *H10K 59/40* (2023.02); *H10K 59/80518* (2023.02)

(58) Field of Classification Search
CPC .... H10K 59/8792; H10K 59/40; H10K 59/38; H10K 59/80518
See application file for complete search history.

(56) References Cited

U.S. PATENT DOCUMENTS

| | | | | |
|---|---|---|---|---|
| 7,795,807 | B2 | 9/2010 | Li | |
| 10,763,312 | B2 | 9/2020 | Jo et al. | |
| 10,916,592 | B2 | 2/2021 | Lee et al. | |
| 2013/0242485 | A1 | 9/2013 | Ohtani et al. | |
| 2018/0059845 | A1 | 3/2018 | Tada et al. | |
| 2019/0146622 | A1* | 5/2019 | Kang ..................... | H10K 59/40 345/173 |
| 2019/0391705 | A1 | 12/2019 | Saai et al. | |
| 2022/0209203 | A1 | 6/2022 | Kim et al. | |
| 2022/0223656 | A1 | 7/2022 | Kim | |
| 2023/0276681 | A1* | 8/2023 | Kim ....................... | H10K 59/40 |

FOREIGN PATENT DOCUMENTS

KR 10-2019-0128010 A 11/2019

* cited by examiner

*Primary Examiner* — Peniel M Gumedzoe
(74) *Attorney, Agent, or Firm* — Innovation Counsel LLP

(57) ABSTRACT

A display device is disclosed that includes sub-pixels forming respective sub-pixel areas. Each of the sub-pixels may include: a display part; a sensor part disposed on the display part, and including a reflective electrode overlapping the sub-pixel areas; and an outer part disposed on the sensor part, and including a light blocking member overlapping the reflective electrode.

20 Claims, 10 Drawing Sheets

DISPLAY DEVICE

CROSS-REFERENCE TO RELATED APPLICATION

The present application claims priority to and benefits of Korean patent application No. 10-2023-0065243 under 35 U.S.C. § 119, filed on May 19, 2023, in the Korean Intellectual Property Office, the entire content of which is incorporated herein by reference.

BACKGROUND

Field of Invention

Various embodiments of the present disclosure relate to a display device.

Description of Related Art

With the development of information technology, the importance of a display device, which is a connection medium between a user and information, has been emphasized.

The display devices may include a display panel configured to display image data, and a sensing panel configured to sense an object. The sensing panel may be used to determine a position of touch input provided from a user.

A process of fabricating a display device may include one or more process steps. To reduce the process cost, there is a need for a display device manufacturing process having simplified process steps.

Furthermore, a structure for improving external visibility is needed for the display device. For example, there is a need to adjust external light reflectivity to improve the external visibility.

SUMMARY

Various embodiments of the present disclosure are directed to a display device having improved visibility.

Various embodiments of the present disclosure are directed to a display device which can be fabricated through simplified process steps, resulting in reduction in the process cost.

An embodiment of a display device of the present disclosure includes sub-pixels forming respective sub-pixel areas. Each of the sub-pixels may include: a display part; a sensor part disposed on the display part, and including a reflective electrode overlapping the sub-pixel areas; and an outer part disposed on the sensor part, and including a light blocking member overlapping the reflective electrode.

In an embodiment, the sensor part may include a first conductive pattern layer, a second conductive pattern layer, and an insulating layer disposed between the first conductive pattern layer and the second conductive pattern layer. The reflective electrode may be formed of the second conductive pattern layer.

In an embodiment, the sensor part may include a sensing electrode formed of the second conductive pattern layer, and the sensing electrode and the reflective electrode may include an identical material.

In an embodiment, the insulating layer and the reflective electrode may contact each other.

In an embodiment, the display part may include a base layer disposed on a planar surface, and a light emitting element disposed on the base layer and including an emission layer. The light blocking member may include a first light blocking member and a second light blocking member spaced apart from each other in a direction in which the planar surface extends. In a plan view, the first light blocking member may be disposed in the sub-pixel areas, and the second light blocking member may be disposed in an area between the sub-pixel areas.

In an embodiment, a lower surface of the reflective electrode may face the emission layer, and an upper surface of the reflective electrode may face the second light blocking member.

In an embodiment, in a plan view, the reflective electrode may not overlap the first light blocking member, and may overlap the second light blocking member.

In an embodiment, the display device may further include a pixel defining layer formed to define an area where the emission layer is disposed. The sensor part may include a sensing electrode disposed on a same layer as the reflective electrode. The reflective electrode and the second light blocking member may overlap the emission layer, in a plan view. The sensing electrode and the first light blocking member may overlap the pixel defining layer, in a plan view.

In an embodiment, the outer part may further include a color filter configured to allow a color of light to selectively pass therethrough. The color filter may contact the reflective electrode.

In an embodiment, the color filter may cover an overall upper surface of the reflective electrode.

In an embodiment, the second light blocking member may be disposed on the color filter, and brought into contact with the color filter.

In an embodiment, the first light blocking member may be brought into contact with the color filter, and spaced apart from the reflective electrode, in a plan view.

In an embodiment, the light blocking member may include a light absorbent material. Light provided from the display part may include first light and second light. The first light may be emitted outward through an area where the reflective electrode is not disposed, and the second light may be reflected by a lower surface of the reflective electrode, and reflected by at least some layers of the display part, and then emitted outward. External light introduced from an outside of the display device may be reflected by an upper surface of the reflective electrode and absorbed by the light blocking member.

In an embodiment, the first light blocking member may have a first light blocking width. The second light blocking member may have a second light blocking width. The second light blocking width may be less than the first light blocking width.

In an embodiment, the reflective electrode may have an electrode width. The electrode width may be less than the second light blocking width.

In an embodiment, the light blocking member may include a first light blocking member disposed between the sub-pixel areas, and a second light blocking member disposed in the sub-pixel areas. The second light blocking member may include a plurality of components disposed in any one of the sub-pixel areas.

In an embodiment, the sub-pixel areas may include a first sub-pixel area and a second sub-pixel area. The light blocking member may include a first light blocking member disposed between the first sub-pixel area and the second sub-pixel area, and a second light blocking member disposed in the first sub-pixel area and the second sub-pixel area. The second light blocking member may include a 2_1-th light blocking member disposed in the first sub-pixel area, and a 2_2-th light blocking member disposed in the second sub-pixel area. A width of the 2_2-th light blocking member is greater than a width of the 2_1-th light blocking member.

In an embodiment, the sub-pixel areas may include a first sub-pixel area and a second sub-pixel area. The light blocking member may include a first light blocking member disposed between the first sub-pixel area and the second sub-pixel area, and a second light blocking member disposed in the second sub-pixel area. The second light blocking member may not be disposed in the first sub-pixel area.

An embodiment of a display device of the present disclosure includes a display device formed on the base layer, and provided to form sub-pixels; a sensor part disposed on the display part, and including a first conductive pattern layer, a second conductive pattern layer, and an insulating layer disposed between the first conductive pattern layer and the second conductive pattern layer; and an outer part disposed on the sensor part, and including a color filter and a light blocking member. The sub-pixels may respectively form sub-pixel areas each providing a color of light. The light blocking member may include a first light blocking member disposed in the sub-pixel areas, and a second light blocking member disposed between the sub-pixel areas. The second conductive pattern layer may include a reflective electrode overlapping the sub-pixel areas in a plan view. The second light blocking member may be disposed on one surface of the color filter and brought into contact with the color filter. The color filter may cover an overall upper surface of the reflective electrode.

An embodiment of a display device of the present disclosure includes a display device formed on the base layer, and provided to form sub-pixels; a sensor part disposed on the display part, and including a first conductive pattern layer, a second conductive pattern layer, and an insulating layer disposed between the first conductive pattern layer and the second conductive pattern layer; and an outer part disposed on the sensor part, and including a color filter and a light blocking member. The sub-pixels may respectively form sub-pixel areas each providing a color of light. The sub-pixel areas may include a first sub-pixel area and a second sub-pixel area. The light blocking member may include a first light blocking member disposed between the sub-pixel areas, and a second light blocking member disposed in the second sub-pixel area. The second light blocking member may not be disposed in the first sub-pixel area. The second conductive pattern layer may include a sensing electrode and a reflective electrode. The reflective electrode may overlap the second light blocking member in a plan view.

DETAILED DESCRIPTION

Figure 1:
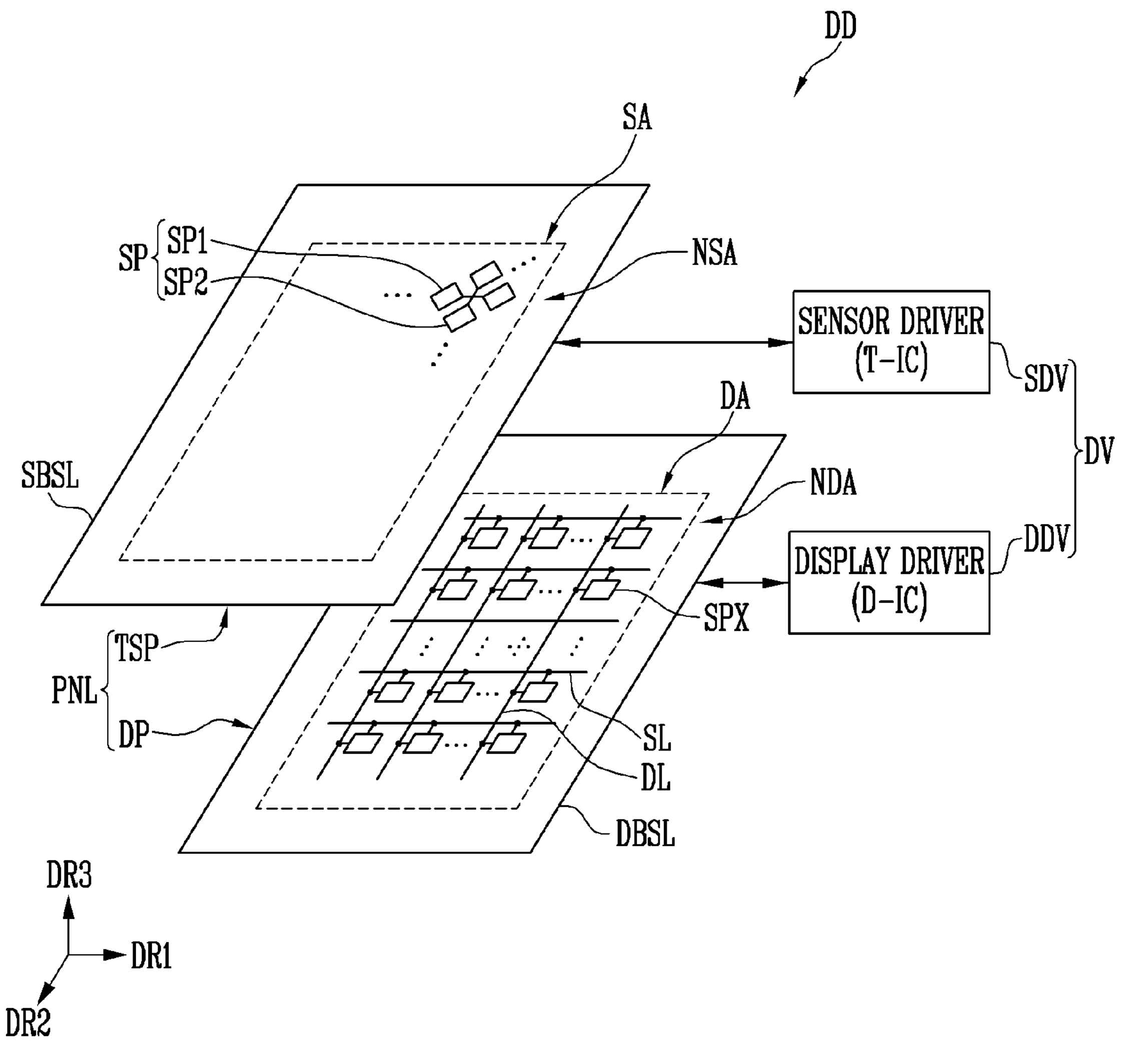
FIG. 1 is a diagram for describing a display device in accordance with an embodiment.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in the present disclosure, specify the presence of stated features, integers, steps, operations, elements, components, or combinations of them but do not preclude the presence or addition of one or more other features, integers, steps, operations, elements, components, or combinations thereof. Furthermore, in case that a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Various embodiments of the present disclosure relates to a display device. Hereinafter, a display device in accordance with an embodiment will be described with reference to the attached drawings.

Figure 2:
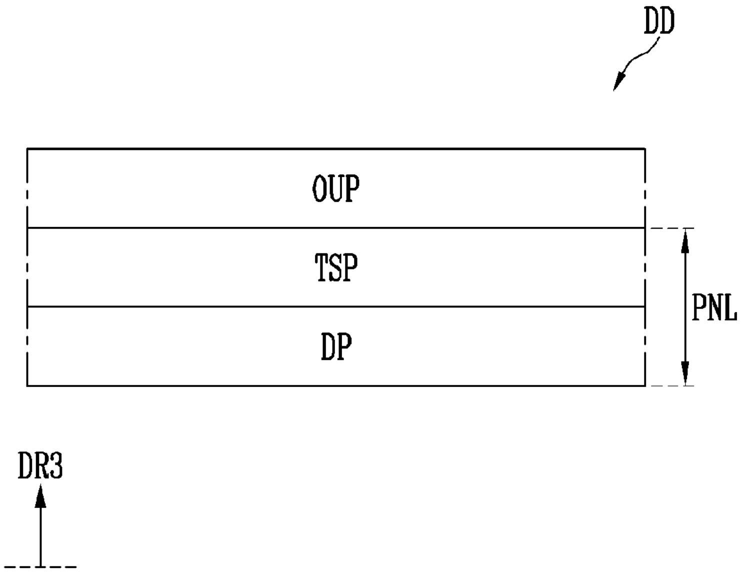
FIG. 2 is a schematic sectional view for describing a stack structure of the display device in accordance with an embodiment.

FIG. 1 is a diagram for describing a display device DD in accordance with an embodiment. FIG. 2 is a schematic sectional view for describing a stack structure of the display device DD in accordance with an embodiment.

Referring to FIGS. 1 and 2, the display device DD may be configured to provide (or emit) light. The display device DD may include a panel PNL, and a driving circuit component DV configured to drive the panel PNL. The display device DD may include an outer part OUP.

The panel PNL (or respective sub-pixel SPX) the may include a display part DP configured to display an image, and a sensor part TSP configured to sense user input (e.g., touch input). The display part DP may be referred to as a display panel. The sensor part TSP may be referred to as a sensing panel.

The panel PNL may include sub-pixels SPX and sensing electrodes SP. In an embodiment, the sub-pixels SPX may display an image during each display frame period. The sensing electrodes SP may sense input (e.g., touch input) from the user during each sensing frame period. The sensing frame period and the display frame period may be independent from each other, or may be different from each other. The sensing frame period and the display frame period may be synchronized with each other, or may not be synchronized.

The sensor part TSP including the sensing electrodes SP may obtain information about the touch input from the user. In an embodiment (e.g., using a mutual capacitance scheme), the sensing electrodes SP may include a first sensing electrode SP1 configured to provide a first sensing signal, and a second sensing electrode SP2 configured to provide a second sensing signal. In an embodiment, the first sensing electrode SP1 may be a transmitter (Tx) pattern electrode, and the second sensing electrode SP2 may be a receiver (Rx) pattern electrode. Information about the touch input (or a touch event) may mean information including a position or the like of a touch provided from the user.

However, the present disclosure is not limited to the foregoing. For example, in an embodiment (e.g., using a mutual capacitance scheme), the sensing electrodes SP may be configured of one kind of sensing electrodes without being classified into the first sensing electrode SP1 and the second sensing electrode SP2.

The driving circuit component DV may include a display driver DDV configured to drive the display part DP, and a sensor driver SDV configured to drive the sensor part TSP.

The display part DP may include a display base layer DBSL, and sub-pixels SPX provided on the display base layer DBSL. The sub-pixels SPX may be disposed in the display area DA.

The display base layer DBSL (or the display device DD) may include a display area DA formed to display an image, and a non-display area NDA which is an area other than the display area DA. In an embodiment, the display area DA may be disposed in a central portion of the display part DP, and the non-display area NDA may be disposed adjacent to a periphery of the display area DA.

The display base layer DBSL may be a base substrate or a base component for supporting the display device DD. The base layer may be a rigid substrate made of glass. Alternatively, the base layer may be a flexible substrate which can be bent, folded, or rolled. In this case, the base layer may include insulating material such as polymer resin, e.g., polyimide. However, the present disclosure is not particularly limited to the foregoing.

Scan lines SL, data lines DL, and sub-pixels SPX connected to the scan lines SL and the data lines DL may be disposed in the display area DA. The sub-pixels SPX may be selected by scan signals each of which has a turn-on level, and which are supplied from the scan lines SL, may be supplied with data signals from the data lines DL, and may emit light having luminance corresponding to the data signals. Consequently, an image corresponding to the data signals may be displayed in the display area DA. In the present disclosure, the structure of the sub-pixels SPX and the method of driving the sub-pixels SPX are not particularly limited.

Various lines, an internal circuit component (or components), or a combination thereof which are connected to the sub-pixels SPX in the display area DA may be disposed in the non-display area NDA. For example, a plurality of lines for supplying various power voltages and control signals to the display area DA may be disposed in the non-display area NDA.

The display part DP may output visible information (e.g., an image). In an embodiment, the type/kind of the display part DP is not particularly limited. For example, the display part DP may be implemented as a self-emissive-type display panel such as an organic light emitting display panel. However, in the case in which the display part DP is implemented as a self-emissive type, each pixel is not limited to the case where the pixel includes only an organic light emitting element. For example, the light emitting element of each pixel may be formed of an organic light emitting diode, an inorganic light emitting diode, a quantum dot/well light emitting diode, or the like. In an embodiment, the display part DP may be implemented as a non-emission type display panel such as a liquid crystal display panel. In the case in which the display part DP is implemented as a non-emission type, the display device DD may further include a light source such as a back-light unit.

Hereinafter, for convenience of explanation, description will be made based on an embodiment in which the display part DP is implemented as an organic light emitting display panel.

The sensor part TSP may include a sensor base layer SBSL, and a plurality of sensing electrodes SP formed on the sensor base layer SBSL. The sensing electrodes SP may be disposed in a sensing area SA on the sensor base layer SBSL.

The sensor base layer SBSL (or the display device DD) may include the sensing area SA capable of sensing touch input or the like, and a non-sensing area NSA formed around a periphery of the sensing area SA. In an embodiment, the sensing area SA may be disposed to overlap at least one area of the display area DA. For example, the sensing area SA may be set to an area corresponding to the display area DA (e.g., an area overlapping the display area DA). The non-sensing area NSA may be set to an area corresponding to the non-display area NDA (e.g., an area overlapping the non-display area NDA). In this case, when touch input or the like is provided on the display area DA, the sensor part TSP may detect the touch input.

The sensor base layer SBSL may include one or more insulating layers {e.g., a first insulating layer INS1 (refer to FIG. 4)}. For example, the first insulating layer INS1 provided to form the sensor base layer SBSL may be disposed on the display part DP, thus forming a base on which the sensing electrodes SP are to be formed. However, an example pertaining to forming the sensor base layer SBSL is not particularly limited.

The sensing area SA may be set to an area (i.e., an active area of the sensor) capable of responding to touch input. To this end, the sensor electrodes SP for sensing the touch input or the like may be disposed in the sensing area SA.

The sensor part TSP may obtain information about input provided from the user. The sensor part TSP may recognize the touch input. The sensor part TSP may use a capacitive sensing scheme to recognize the touch input. The sensor part TSP may sense the touch input in a mutual capacitance scheme, or may sense the touch input in a self-capacitance scheme.

In an embodiment, each of the first sensing electrodes SP1 may extend in a first direction DR1. The first sensing electrodes SP1 may be arranged in a second direction DR2. The second direction DR2 may differ from the first direction DR1. For example, the second direction DR2 may be a direction perpendicular to the first direction DR1.

In an embodiment, each of the second sensing electrodes SP2 may extend in the second direction DR2. The second sensing electrodes SP2 may be arranged in the first direction DR1.

In an embodiment, the first sensing electrodes SP1 and the second sensing electrodes SP2 may have a same shape (e.g., substantially a same shape). For example, the first sensing electrodes SP1, which are Tx pattern electrodes, and the second sensing electrodes SP2, which area Rx pattern electrodes, may have shapes corresponding to each other (for example, substantially a same shape), so that the performance of sensing a touch event in the sensing area SA can be set to be uniform.

In the non-sensing area NSA of the sensor part 120, sensing lines may be disposed to electrically connect the sensing electrodes SP with the sensor driver SDV or the like.

The driving circuit component DV may include a display driver DDV configured to drive the display part DP, and a sensor driver SDV configured to drive the sensor part TSP.

The display driver DDV may be electrically connected to the display part DP and configured to drive the sub-pixels SPX. The sensor driver SDV may be electrically connected to the sensor part TSP and configured to drive the sensor part TSP.

The outer part OUP may be disposed in substantially the outer portion of the display device DD. The outer part OUP may be disposed on the sensor part TSP. Light provided from the display device DP may be emitted to the outside through the outer part OUP. In an embodiment, the outer part OUP may include a window. In an embodiment, the outer part OUP may include a color filter CF (refer to FIG. 8), a light blocking member BM (refer to FIG. 8), and an overcoat layer OC (refer to FIG. 8).

Figure 3:
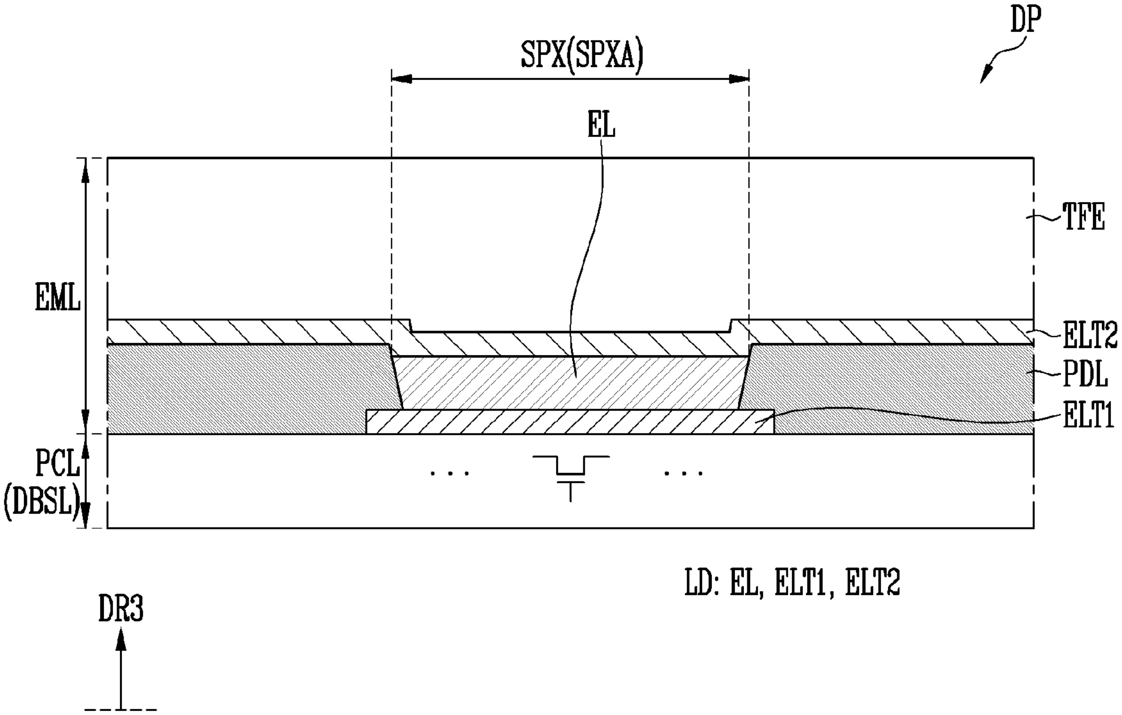
FIG. 3 is a schematic sectional view illustrating a display part in accordance with an embodiment.

Next, an embodiment of the display part DP will be described with reference to FIG. 3. FIG. 3 is a schematic sectional view illustrating the display part DP in accordance with an embodiment.

Referring to FIG. 3, the display part DP may include a pixel circuit layer PCL, and a light-emitting-element layer EML.

The pixel circuit layer PCL may include a pixel circuit configured to drive light emitting elements LD. The pixel circuit layer PCL may include a display base layer DBSL, conductive layers formed to form pixel circuits, and insulating layers disposed between the conductive layers.

The pixel circuit may include a driving transistor, a switching transistor, and a storage capacitor. The pixel circuit may include a thin film transistor. The pixel circuit may be electrically connected to the light emitting elements LD, and may provide electrical signals to allow the light emitting elements LD to emit light.

The light-emitting-element layer EML may be disposed on the pixel circuit layer PCL. In an embodiment, the light-emitting-element layer EML may include a light emitting element LD, a pixel defining layer PDL, and an encapsulation layer TFE.

The light emitting element LD may be disposed on the pixel circuit layer PCL. In an embodiment, the light emitting element LD may include a first electrode ELT1, an emission layer EL, and a second electrode ELT2. In an embodiment, the emission layer EL may be disposed in an area defined by the pixel defining layer PDL. The pixel defining layer PDL may be adjacent to a periphery of the emission layer EL. One surface of the emission layer EL may be electrically connected to the first electrode ELT1. The other surface of the emission layer EL may be electrically connected to the second electrode ELT2.

The first electrode ELT1 may be an anode electrode for the emission layer EL. The second electrode ELT2 may be a common electrode (or a cathode electrode) for the emission layer EL. In an embodiment, the first electrode ELT1 and the second electrode ELT2 may include conductive material. For example, the first electrode ELT1 may include conductive material having reflexibility. The second electrode ELT2 may include transparent conductive material. However, the present disclosure is not limited thereto.

The emission layer EL may have a multilayer thin-film structure including a light generation layer. The emission layer EL may include: a hole injection layer provided to inject holes; a hole transport layer which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer which restrains movement of holes that have not been coupled with electrons in the light generation layer; an electron transport layer which is provided to smoothly transport electrons to the light generation layer; and an electron injection layer provided to inject electrons. The emission layer EL may emit light based on an electrical signal which is provided from the first electrode ELT1 and the second electrode ELT2.

The emission layer EL may form a sub-pixel SPX. The emission layer EL may form a sub-pixel area SPXA configured to emit a color of light. In a plan view, an area of the emission layer EL and the sub-pixel area SPXA may correspond to each other. For example, each emission layer EL may correspond to an associated sub-pixel area SPXA.

The pixel defining layer PDL may be disposed on the pixel circuit layer PCL, and may define a position at which the emission layer EL is to be disposed. The pixel defining layer PDL may include organic material. In an embodiment, the pixel defining layer PDL may be formed of one or more selected from the group consisting of acryl resin, epoxy resin, phenol resin, polyamide resin, and polyimide resin. However, the present disclosure is not limited thereto. For example, the pixel defining pattern PDL may include inorganic material.

The encapsulation layer TFE may be disposed on the light emitting element LD. The encapsulation layer TFE may offset a step difference formed by the light emitting element LD (e.g., the second electrode ELT2) and the pixel defining layer PDL. The encapsulation layer TFE may include a plurality of insulating layers configured to cover the light emitting element LD. In an embodiment, the encapsulation layer TFE may have a structure formed by alternately stacking inorganic layers and organic layers. In an embodiment, the encapsulation layer TFE may be formed of a thin film encapsulation layer.

Next, the sensor part TSP will be described with reference to FIGS. 4 to 6.

Figure 4:
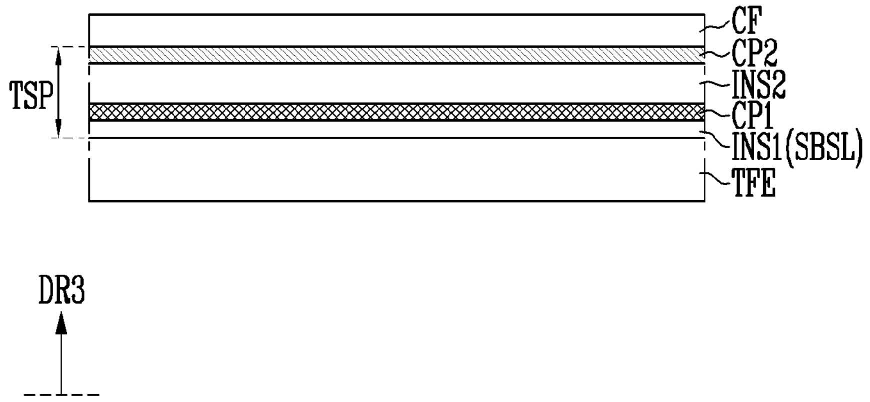
FIG. 4 is a schematic sectional view illustrating a sensor part in accordance with an embodiment.

FIG. 4 is a schematic sectional view illustrating the sensor part TSP in accordance with an embodiment. FIG. 5 is a schematic plan view illustrating sensing electrodes in accordance with an embodiment. FIG. 5 illustrates a schematic planar structure showing an area where the first sensing electrode SP1 and the second sensing electrode SP2 are adjacent to each other. FIG. 5 illustrates a planar structure of the first sensing electrode SP1 and the second sensing electrode SP2 each having a certain shape in accordance with an embodiment. FIG. 6 is a schematic sectional view illustrating the sensor part in accordance with an embodiment. FIG. 6 illustrates a schematic sectional structure taken along line A-A' of FIG. 5, and a sectional structure taken along line B-B' of FIG. 5

Figure 5:
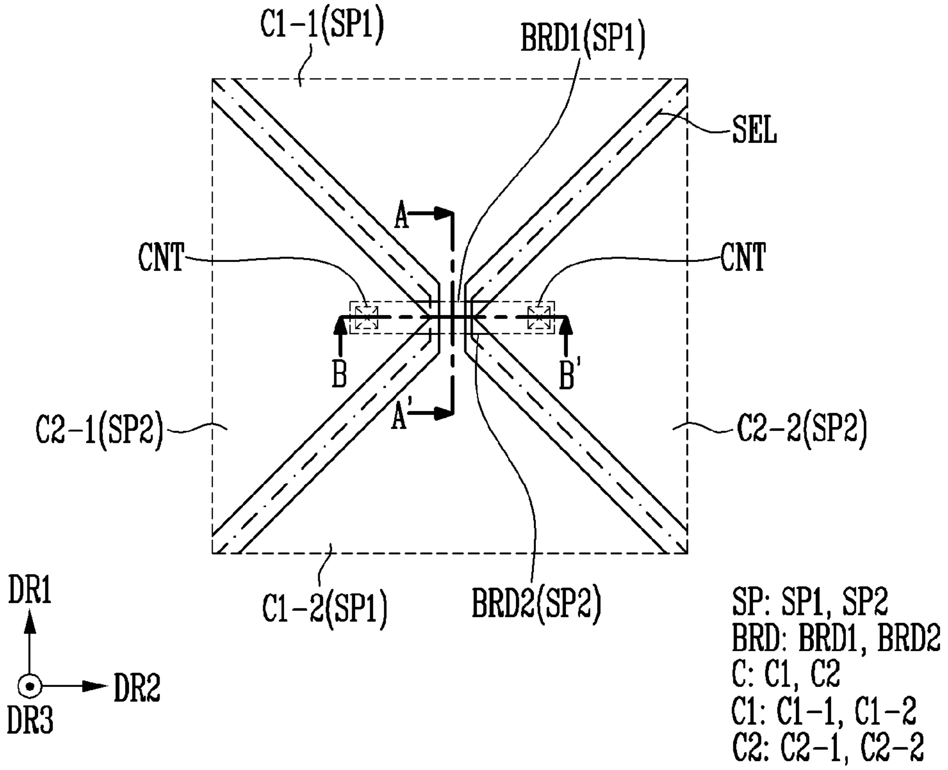
FIG. 5 is a schematic plan view illustrating sensing electrodes in accordance with an embodiment.
Figure 6:
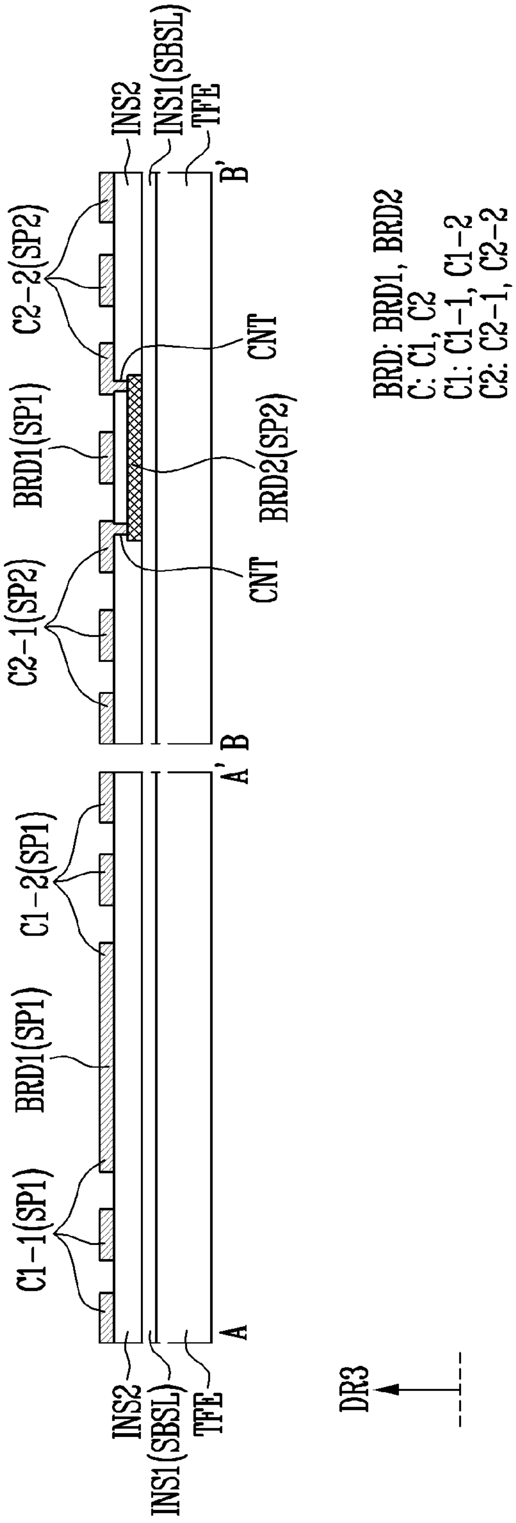
FIG. 6 is a schematic sectional view illustrating the sensor part in accordance with an embodiment.

Referring to FIGS. 4 to 6, the sensor part TSP may be disposed on the encapsulation layer TFE. The sensor part TSP may include a first insulating layer INS1, a first conductive pattern layer CP1, a second insulating layer INS2, and a second conductive pattern layer CP2.

In an embodiment, the first conductive pattern layer CP1 and the second conductive pattern layer CP2 may be patterned in one area to form sensing electrodes SP. For example, a portion of the first conductive pattern CP1 may form the first sensing electrode SP1. A portion of each of the first conductive pattern CP1 and the second conductive pattern CP2 may form the second sensing electrode SP2. Alternatively, a portion of the second conductive pattern CP2 may form the first sensing electrode SP1. A portion of each of the first conductive pattern CP1 and the second conductive pattern CP2 may form the second sensing electrode SP2. However, the present disclosure is not limited thereto.

The first insulating layer INS1 may be disposed on the encapsulation layer TFE. The first insulating layer INS1 may form the sensor base layer SBSL and thus provide an area in which the first conductive pattern layer CP1, the second insulating layer INS2, and the second conductive pattern layer CP2 are disposed.

The first conductive pattern layer CP1 may be disposed on the first insulating layer INS1. The second conductive pattern layer CP2 may be disposed on the second insulating layer INS2. The first conductive pattern layer CP1 and the second conductive pattern layer CP2 may be spaced apart from each other with the second insulating layer INS2 interposed therebetween.

Each of the first conductive pattern layer CP1 and the second conductive pattern layer CP2 may include a single metallic layer or multiple metallic layers. Each of the first conductive pattern layer CP1 and the second conductive pattern layer CP2 may include at least one of various metals including gold (Au), silver (Ag), aluminum (Al), molybdenum (Mo), chrome (Cr), titanium (Ti), nickel (Ni), neodymium (Nd), copper (Cu), platinum (Pt), and the like, or an alloy thereof. In an embodiment, the first conductive pattern layer CP1 may include at least one of various transparent conductive materials including at least one among a silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide ($SnO_2$), carbon nanotubes, and graphene.

In an embodiment, the second conductive pattern layer CP2 may form a reflective electrode RL (refer to FIG. 8), which embodies a light recycle structure to improve light output efficiency.

The second insulating layer INS2 may be disposed on the first conductive pattern layer CP1. The second insulating layer INS2 may be interposed between the first conductive pattern layer CP1 and the second conductive pattern layer CP2.

The first insulating layer INS1 may include one or more of inorganic material and organic material. The second insulating layer INS2 may include one or more of inorganic material and organic material. The inorganic material may include one or more selected from the group consisting of silicon nitride (SiNx), silicon oxide (SiOx), silicon oxynitride (SiOxNy), and aluminum oxide (AlOx). The organic material may include one or more selected from the group consisting of acryl resin, epoxy resin, phenol resin, polyamide resin, and polyimide resin. However, the present disclosure is not limited thereto.

In an embodiment, the color filter CF may be directly disposed on the sensor part TSP. The second conductive pattern layer CP2 may be covered with the color filter CF or the light blocking member BM.

The color filter CF may be configured to allow a color of light to selectively pass therethrough, thus making it possible for the display device DD to embody a full-color pixel structure. The color filter CF may include organic material to protect other components. For example, the color filter CF may insulate the second conductive pattern layer CP2 from other components and protect the second conductive pattern CP2, and may function as a functional layer for improving the quality of the display device DD.

In this case, one or more layers that are provided as separate layers in the conventional art may be manufactured through a single process, whereby the process steps may be facilitated. For example, the number of masks required for fabricating the display device in accordance with an embodiment may be reduced, thus resulting in reduction in production cost.

The display device DD in accordance with an embodiment may not include a separate polarizing layer, thus resulting in improved light output efficiency. Furthermore, in an embodiment, the display device DD is configured such that the color filter CF including organic dyes is positioned at the top side. As a result, the physical characteristics required for operations such as bending, rolling, or folding of the display device DD can be enhanced.

Each of the sensing electrodes SP may include a cell C and a bridge BRD. The cell C may have a relatively large surface area. The bridge BRD may have a relatively small surface area. Cells C adjacent to each other may be electrically connected to each other by the bridge BRD. The cell C may include a first cell C1 and a second cell C2. The bridge BRD may include a first bridge BRD1 and a second bridge BRD2.

In an embodiment, the first cell C1 and the second cell C2 may be formed of the second conductive pattern layer CP2. The first bridge BRD1 may be formed of the second conductive pattern layer CP2. A portion of the second bridge BRD2 may be formed of the first conductive pattern layer CP1. The other portion of the second bridge BRD2 may be formed of the second conductive pattern layer CP2.

However, the present disclosure is not limited to the foregoing. For example, the first cell C1 and the second cell C2 may be formed of the first conductive pattern layer CP1. The first bridge BRD1 may be formed of the first conductive pattern layer CP1. A portion of the second bridge BRD2 may be formed of the second conductive pattern layer CP2. The other portion of the second bridge BRD2 may be formed of the first conductive pattern layer CP1.

In an embodiment, the sensing electrodes SP may form a mesh structure. The cells C and the bridges BRD may form a mesh structure. For example, the second conductive pattern layer CP2 for forming the sensing electrodes SP may be patterned according to a mesh structure. As the sensing electrodes SP form a mesh structure, the capacitance which may be formed with other electrodes disposed under the cells C may be reduced.

The first sensing electrode SP1 may have a structure in which the first cells C1 each having a relatively large surface area and the first bridge BRD1 having a relatively small surface area are connected to each other. For example, the first cell C1 may include a 1-1-th cell C1-1 and a 1-2-th cell C1-2. The first bridge BRD1 may electrically connect the 1-1-th cell C1-1 and the 1-2-th cell C1-2 to each other.

The second sensing electrode SP2 may have a structure in which the second cells C2 each having a relatively large surface area and the second bridge BRD2 having a relatively small surface area are connected to each other. For example, the second cell C2 may include a 2-1-th cell C2-1 and a 2-2-th cell C2-2. The second bridge BRD2 may electrically connect the 2-1-th cell C2-1 and the 2-2-th cell C2-2 to each other.

In an embodiment, the second bridge BRD2 may be electrically connected to the 2-1-th cell C2-1 through a contactor CNT, and may be electrically connected to the 2-2-th cell C22 through another contactor CNT. Hence, the second bridge BRD2 that is disposed on a layer different from that of the second cell C2 may electrically connect the 2-1-th cell C2-1 and the 2-2-th cell C2-2 to each other through the contactor CNT. In an embodiment, the contactor CNT may pass through the second insulating layer INS2.

The first cell C1 and the second cell C2 each may have a diamond shape. However, the shape of each of the first cell C1 and the second cell C2 is not particularly limited to the foregoing shape. For example, each of the first cell C1 and the second cell C2 may have a rectangular shape.

The first sensing electrodes SP1 and the second sensing electrodes SP2 may be adjacent to each other with a separation line SEL interposed therebetween. The separation line SEL may be an imaginary line disposed in an area between the first sensing electrodes SP1 and the second sensing electrodes SP2. For example, the separation line SEL may be disposed between the 1-1-th cell C1-1 and the 1-2-th cell C1-2. The separation line SEL may be disposed between the first bridge BRD1 and the 1-2-th cell C1-2.

Next, a display device DD in accordance with a first embodiment will be described with reference to FIGS. 7 to 9.

Figure 7:
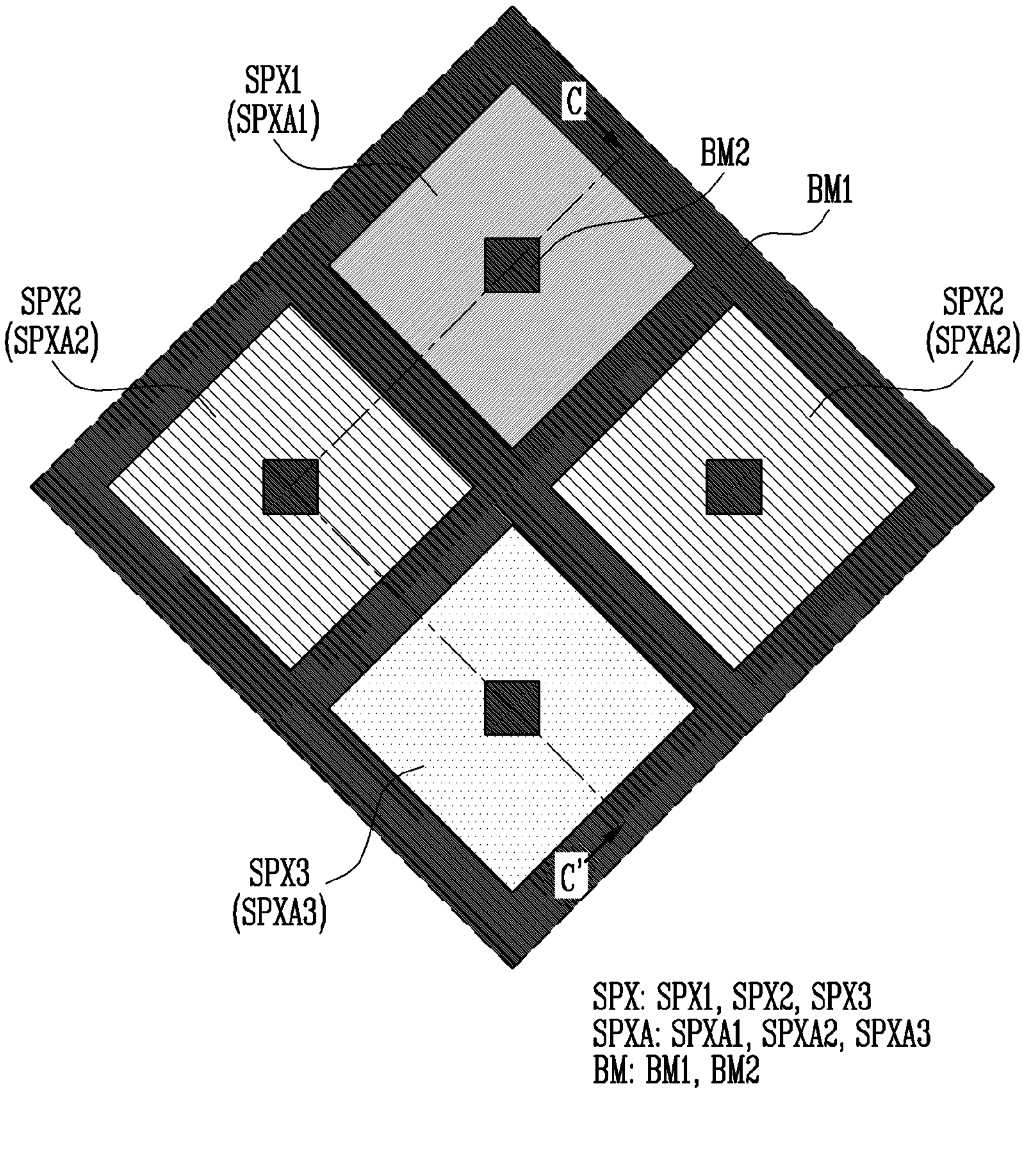
FIGS. 7, 8 and 9 are schematic views illustrating a display device in accordance with a first embodiment.
Figure 8:
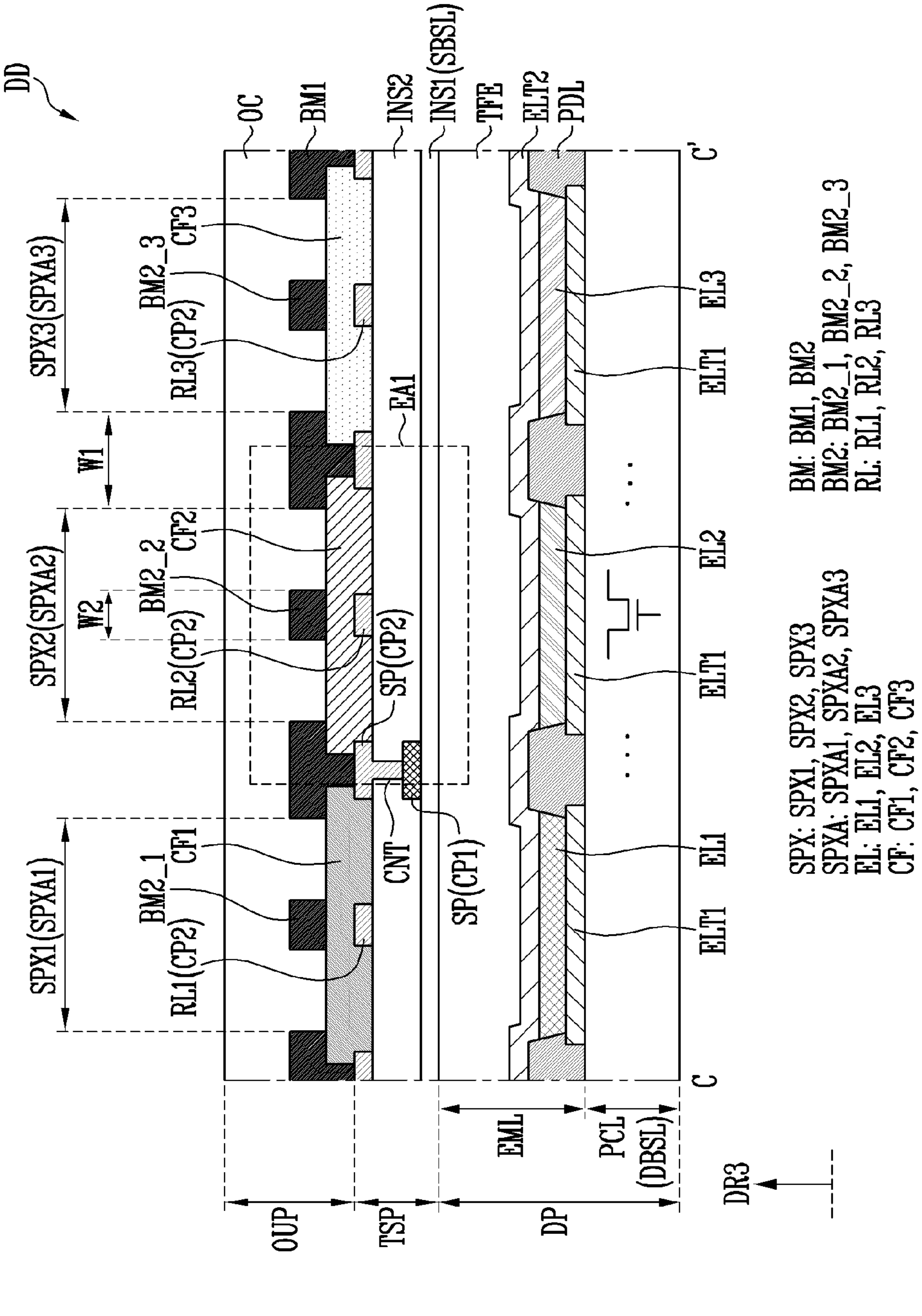
Figure 9:
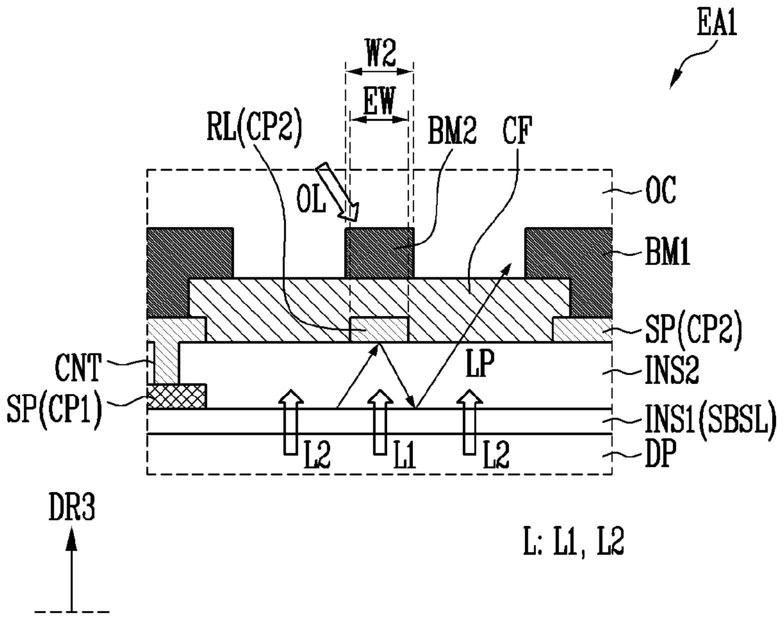

FIGS. 7 to 9 are schematic views illustrating a display device in accordance with the first embodiment. FIG. 7 is a schematic plan view illustrating the display device in accordance with the first embodiment. FIG. 8 is a schematic sectional view taken along line C-C' of FIG. 7. FIG. 9 is a schematic enlarged view of area EA1 of FIG. 8.

In an embodiment, the sub-pixel SPX may include two or more sub-pixels. For example, the sub-pixel SPX may include a first sub-pixel SPX1, a second sub-pixel SPX2, and a third sub-pixel SPX3.

The sub-pixel area SPXA may include a first sub-pixel area SPXA1 in which a first sub-pixel SPX1 is formed, a second sub-pixel area SPXA2 in which a second sub-pixel SPX2 is formed, and a third sub-pixel area SPXA3 in which a third sub-pixel SPX3 is formed.

The sub-pixels SPX may be arranged in various structures (e.g., a stripe structure or a PENTILE™ structure). The arrangement structure of the sub-pixels SPX is not limited to a specific example.

The emission layer EL may include a first emission layer EL1 included in the first sub-pixel SPX1, a second emission layer EL2 included in the second sub-pixel SPX2, and a third emission layer EL3 included in the third sub-pixel SPX3. The first emission layer EL1 may emit a first color of light (e.g., red light), and may form a first sub-pixel area SPXA1. The second emission layer EL2 may emit a second color of light (e.g., green light), and may form a second sub-pixel area SPXA2. The third emission layer EL3 may emit a third color of light (e.g., blue light), and may form a third sub-pixel area SPXA3. However, the present disclosure is not limited to the foregoing example. The first to third emission layers EL1, EL2, and EL3 may emit a same color of light.

In an embodiment, the wavelength band of red light may include a wavelength band ranging from 600 nm to 750 nm. The wavelength band of green light may include a wavelength band ranging from 480 nm to 560 nm. The wavelength band of blue light may include a wavelength band ranging from 370 nm to 460 nm.

In the sensor part TSP, the first conductive pattern layer CP1 and the second conductive pattern layer CP2 may be disposed on different layers, thus forming the structure of the sensing electrodes SP.

In an embodiment, the second conductive pattern layer CP may form a reflective electrode RL. The reflective electrode RL may be disposed in a same layer as the cells C, and may include a same material as the cells C.

The reflective electrode RL may include one or more of the materials described above with reference to the second conductive pattern layer CP2. The reflective electrode RL may include a same material as the sensing electrode SP formed of the second conductive pattern layer CP2. The reflective electrode RL may be configured to reflect light leading to an in improvement in the light output efficiency of the display device DD.

In an embodiment, the reflective electrode RL may be included in each of the sub-pixels SPX. For example, the reflective electrode RL may include a first reflective electrode RL1 included in the first sub-pixel SPX1, a second reflective electrode RL2 included in the second sub-pixel SPX2, and a third reflective electrode RL3 included in the third sub-pixel SPX3.

The reflective electrode RL may overlap the sub-pixel area SPXA, in a plan view. For example, the first reflective electrode RL1 may overlap the first sub-pixel area SPXA1, in a plan view. The second reflective electrode RL2 may overlap the second sub-pixel area SPXA2, in a plan view. The third reflective electrode RL3 may overlap the third sub-pixel area SPXA3, in a plan view.

The reflective electrode RL may not overlap a first light blocking member BM1, in a plan view. The reflective electrode RL may overlap a second light blocking member BM2, in a plan view. For example, the first reflective electrode RL1 may overlap a 2_1-th light blocking member BM2_1, in a plan view. The second reflective electrode RL2 may overlap a 2_2-th light blocking member BM2_2, in a plan view. The third reflective electrode RL3 may overlap a 2_3-th light blocking member BM2_3, in a plan view.

The reflective electrode RL may overlap the emission layer EL, in a plan view. For example, the first reflective electrode RL1 may overlap the first emission layer EL1, in a plan view. The second reflective electrode RL2 may overlap the second emission layer EL2, in a plan view. The third reflective electrode RL3 may overlap the third emission layer EL3, in a plan view.

A lower surface of the reflective electrode RL may face the emission layer EL. An upper surface of the reflective electrode RL may face the second light blocking member BM2.

The reflective electrode RL may be disposed on the second insulating layer INS2. In an embodiment, the reflective electrode RL may contact the second insulating layer INS2. The reflective electrode RL may contact the color filter CF. For example, the first reflective electrode RL1 may contact a first color filter CF1. The second reflective electrode RL2 may contact a second color filter CF2. The third reflective electrode RL3 may contact a third color filter CF3.

The outer part OUP may be disposed on the sensor part TSP. The outer part OUP may include color filter CF, the light blocking member BM, and the overcoat layer OC.

The color filter CF may be disposed on the second conductive layer CP2. For example, the color filter CF may be disposed on the sensing electrode SP that forms the cell C. The color filter CF may be disposed on the reflective electrode RL.

The color filter CF may include the first color filter CF1, the second color filter CF2, and the third color filter CF3. Since the first to third color filters CF1, CF2, and CF3 corresponding to the respective colors of the first to third sub-pixels SPX1, SPX2, and SPX3 are disposed, a full-color image may be displayed.

The color filter CF may cover an overall upper surface of the reflective electrode RL. The color filter CF may be directly adjacent to the reflective electrode RL. Hence, the color filter CF may function as a protective layer for the reflective electrode RL. For example, the first color filter CF1 may cover the first reflective electrode RL1. The first color filter CF1 may contact the 2_1-th light blocking member BM2_1 and the first reflective electrode RL1. The second color filter CF2 may cover the second reflective electrode RL2. The second color filter CF2 may contact the 2_2-th light blocking member BM2_2 and the second reflective electrode RL2. The third color filter CF3 may cover the third reflective electrode RL3. The third color filter CF3 may contact the 2_3-th light blocking member BM2_3 and the third reflective electrode RL3.

The first color filter CF1 may be a color filter provided to form the first sub-pixel SPX1, and may overlap the first sub-pixel area SPXA1, in a plan view. The first color filter CF1 allows a first color of light to selectively pass therethrough. The first color filter CF1 may be a red color filter, and may include red color filter material (e.g., a pigment or dye).

The second color filter CF2 may be a color filter provided to form the second sub-pixel SPX2, and may overlap the second sub-pixel area SPXA2, in a plan view. The second color filter CF2 allows a second color of light to selectively pass therethrough. The second color filter CF2 may be a green color filter, and may include green color filter material (e.g., a pigment or dye).

The third color filter CF3 may be a color filter provided to form the third sub-pixel SPX3, and may overlap the third sub-pixel area SPXA3, in a plan view. The third color filter CF3 allows a third color of light to selectively pass therethrough. The third color filter CF3 may be a blue color filter, and may include blue color filter material (e.g., a pigment or dye).

The light blocking member BM may be disposed on the second conductive layer CP2 and the color filter CF. The light blocking member BM may contact the color filter CF.

The light blocking member BM may include light blocking material. In an embodiment, the light blocking member BM may include light absorbent material. For example, the light blocking member BM may include a colorant containing one or more of carbon black and lactam black. However, the present disclosure is not limited to the foregoing example. The light absorbent material may include various materials.

The light blocking member BM may include a first light blocking member BM1 and a second light blocking member BM2. The first light blocking member BM1 and the second light blocking member BM2 may be formed through a same process, and may be spaced apart from each other in a direction extending along a plane where the display base layer DBSL is disposed.

The first light blocking member BM1 may be disposed between the sub-pixel areas SPXA. For example, the first light blocking member BM1 may enclose each of the first to third sub-pixel areas SPXA1, SPXA2, and SPXA3, in a plan view.

The second light blocking member BM2 may overlap the sub-pixel area SPXA, in a plan view. For example, the 2_1-th light blocking member BM2_1 may overlap the first sub-pixel area SPXA1, in a plan view. The 2_2-th light blocking member BM2_2 may overlap the second sub-pixel area SPXA2, in a plan view. The 2_3-th light blocking member BM2_3 may overlap the third sub-pixel area SPXA3, in a plan view.

The first light blocking member BM1 may contact the color filter CF and the sensing electrode SP. The second light blocking member BM2 may not contact the sensing electrode SP. For example, the second light blocking member BM2 may be directly disposed on the color filter CF. The 2_1-th light blocking member BM2_1 may contact an upper surface of the first color filter CF1. The 2_2-th light blocking member BM2_2 may contact an upper surface of the second color filter CF2. The 2_3-th light blocking member BM2_3 may contact an upper surface of the third color filter CF3.

The first light blocking member BM1 may overlap the sensing electrode SP and the pixel defining layer PDL, in a plan view.

The first light blocking member BM1 may have a first light blocking width W1. The second light blocking member BM2 may have a second light blocking width W2. The first light blocking width W1 and the second light blocking width W2 may be defined based on a same direction.

In an embodiment, the first light blocking width W1 and the second light blocking width W2 may correspond to each other. Alternatively, in an embodiment, the first light blocking width W1 may be greater than the second light blocking width W2. However, the present disclosure is not limited to the foregoing example.

The overcoat layer OC may be disposed on the color filter CF and the light blocking member BM. The overcoat layer OC may be provided over the first to third sub-pixels SPX1, SPX2, and SPX3. The overcoat layer OC may cover an underlying component including the color filter layer CFL. The overcoat layer OC may prevent water or air from permeating the underlying component. Furthermore, the overcoat layer OC may protect the underlying component from foreign material such as dust.

The overcoat layer OC may include organic material such as acrylic resin, epoxy resin, phenol resin, polyamide resin, polyimide resin, polyester resin, polyphenylene sulfide resin, or benzocyclobutene. The present disclosure is not limited to the aforementioned examples.

In an embodiment, the reflective electrode RL and the second light blocking member BM2 are disposed in the sub-pixel area SPXA, resulting in improved light output efficiency while also preventing external light reflection, thus enhancing the visibility. Related description will be made with reference to FIG. 9.

Although FIG. 9 illustrates area EA1 showing a portion of the second sub-pixel SPX2, as described above, similar technical characteristics may be applied to each of the sub-pixels SPX. Therefore, for the sake of convenience in the explanation, the description will be based on the sub-pixel SPX, the reflective electrode RL, and the second light blocking member BM2.

In an embodiment, the display part DP may provide light L in a display direction (e.g., a third direction DR3). Light L may be provided from an area where the emission layer EL is disposed, and may include first light L1 that travels toward the lower surface of the reflective electrode RL, and second light L2 that is allowed to pass through the second conductive pattern layers CP2.

The first light L1 may be reflected by the lower surface of the reflective electrode RL, and then reflected by the layers in the display part DP outward. For example, downward-facing first light L1 may be reflected by one or more layers disposed in the display part DP or an interface between difference layers, and thus directed upward as reflected light LP.

The second light L2 may pass through the color filter CF through areas between the second conductive pattern layers CP2 having reflective properties, and then be emitted outward.

Consequently, light provided from the display part DP may be recycled or directly emitted outward. As a result, the display device DD may be configured to have high light output efficiency.

On the other hand, external light OL may be applied to the display device DD. Experimentally, in the case where the external light OL is applied into the interior of the display device DD, there is a concern that reflective light derived from the external light OL may be visible to the user, thus potentially degrading the visibility of the display device DD.

In an embodiment, the second light blocking member BM2 is disposed in the sub-pixel area SPXA, thus preventing the external light OL from being introduced into the interior of the display device DD. For example, the second light blocking member BM2 may absorb at least portion of the external light OL. Hence, the risk of degraded visibility of the display device DD due to the external light OL and the reflective light derived from the external light OL may be reduced.

In an embodiment, an electrode width EW of the reflective electrode RL and the second light blocking width W2 of the second light blocking member BM2 may correspond to each other. Alternatively, in an embodiment, the electrode width EW may be less than the second light blocking width W2.

In this case, if portion of the external light OL passes through the color filter CF and is applied to the upper surface of the reflective electrode RL, the applied light may be reflected by the upper surface of the reflective electrode RL and then absorbed by the second light blocking member BM2. Accordingly, the visibility issues caused by the external light OL may be further improved.

Next, a display device DD in accordance with a second embodiment will be described with reference to FIG. 10. Description overlapping that of the contents described above will be simplified, or may not be repeated.

Figure 10:
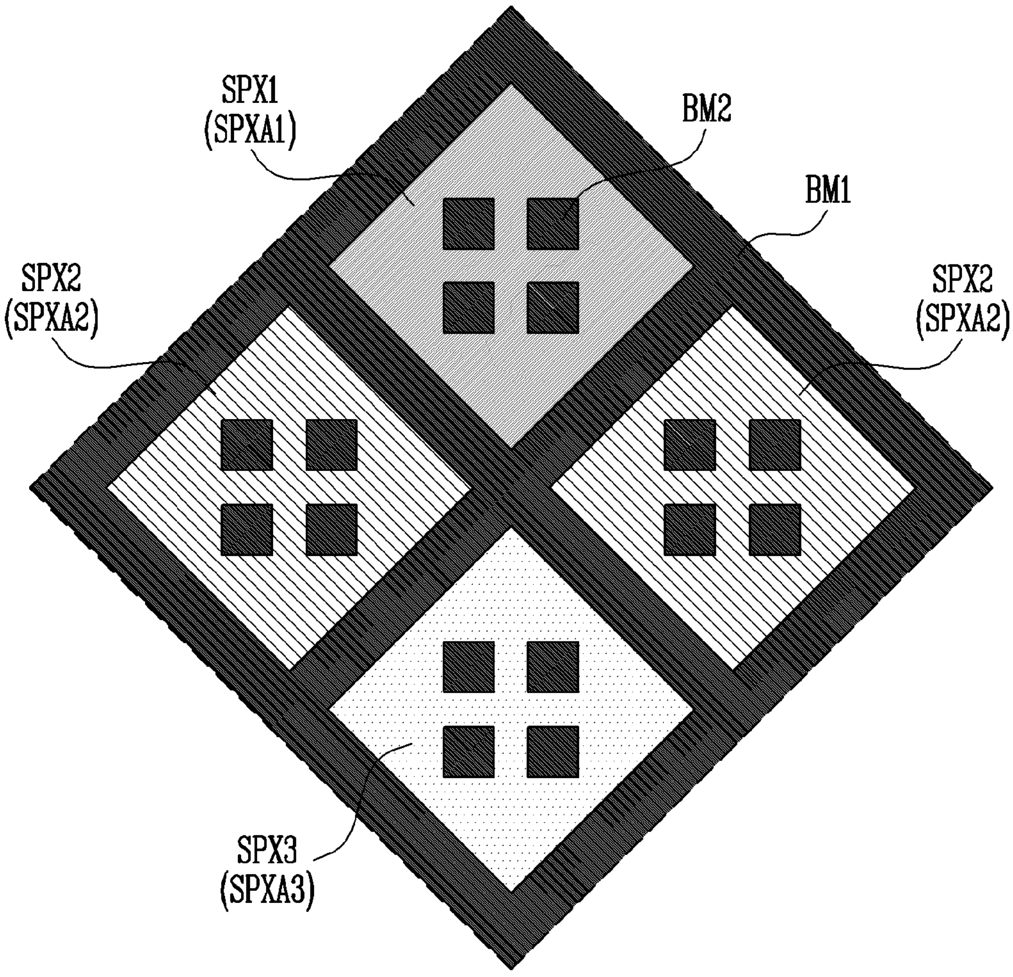
FIG. 10 is a schematic plan view illustrating a display device in accordance with a second embodiment.

FIG. 10 is a schematic plan view illustrating the display device DD in accordance with the second embodiment.

The display device DD in accordance with the second embodiment differs from the display device DD in accordance with the first embodiment in that, in each sub-pixel area SPXA, the second light blocking member BM2 includes a plurality of components spaced apart from each other.

In an embodiment, the second light blocking member BM2 in each sub-pixel area SPXA may include two or more components. For example, two or more components that form the second light blocking member BM2 may be arranged in a matrix array. The number of components that form the second light blocking member BM2 may be four in the sub-pixel area SPXA. However, the present disclosure is not limited to the foregoing example.

In an embodiment, the reflective electrode RL may be disposed under each of the two or more components that form the second light blocking member BM2.

According to the present embodiment, two or more components that form the second light blocking member BM2 may more effectively block the reflection of external light OL.

Next, a display device DD in accordance with a third embodiment will be described with reference to FIG. 11. Description overlapping that of the contents described above will be simplified, or may not be repeated.

Figure 11:
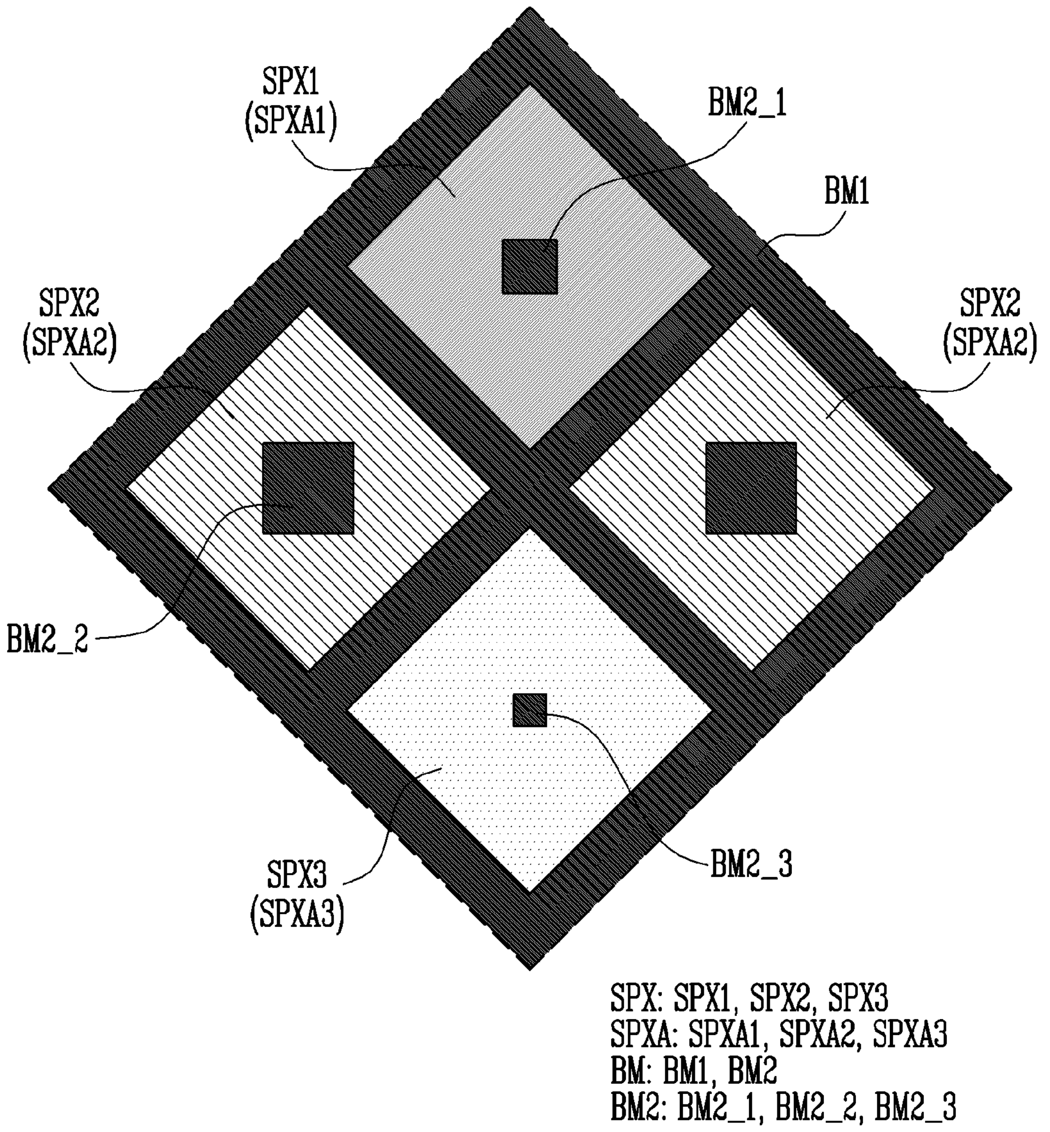
FIG. 11 is a schematic plan view illustrating a display device in accordance with a third embodiment.

FIG. 11 is a schematic plan view illustrating the display device DD in accordance with the third embodiment.

The display device DD in accordance with the third embodiment differs from the display device DD in accordance with the first embodiment in that the size of the second light blocking member BM2 varies by the sub-pixel areas SPXA.

In an embodiment, the size of the second light blocking member BM2 may vary by the colors of the sub-pixels SPX. For example, the size of the 2_2-th light blocking member BM2_2 in the second sub-pixel SPX2 that is a green sub-pixel may be greater than the size of the 2_1-th light blocking member BM2_1 in the first sub-pixel SPX1 that is a red sub-pixel or the size of the 2_3-th light blocking member BM2_3 in the third sub-pixel SPX3 that is a blue sub-pixel. The size of the 2_1-th light blocking member BM2_1 in the first sub-pixel SPX1 that is a red sub-pixel may be greater than the size of the 2_3-th light blocking member BM2_3 in the third sub-pixel SPX3. Here, the size of each of the second light blocking members BM2 may represent the maximum width defined in a plan view.

In an embodiment, reflective electrodes RL having different sizes may be respectively disposed under the second light blocking members BM2 having different sizes. The reflective electrodes RL may satisfy a size relationship similar to that of the light blocking member BM2. For example, the second reflective electrode RL2 may be greater than the first reflective electrode RL1 or the third reflective electrode RL3. The first reflective electrode RL1 may be greater than the third reflective electrode RL3.

According to the present embodiment, the size of the second light blocking member BM2 may be adjusted for each sub-pixel area SPXA, whereby luminance differences of the sub-pixels SPX may be compensated for based on respective colors. For example, the second light blocking members BM disposed in the sub-pixels SPX that emit light having relatively high luminance may be manufactured to have larger sizes. Accordingly, the luminance differences between the sub-pixels SPX may be compensated for. As a result, the color quality of the display device DD may be further enhanced.

Next, a display device DD in accordance with a fourth embodiment will be described with reference to FIG. 12. Description overlapping that of the contents described above will be simplified, or may not be repeated.

Figure 12:
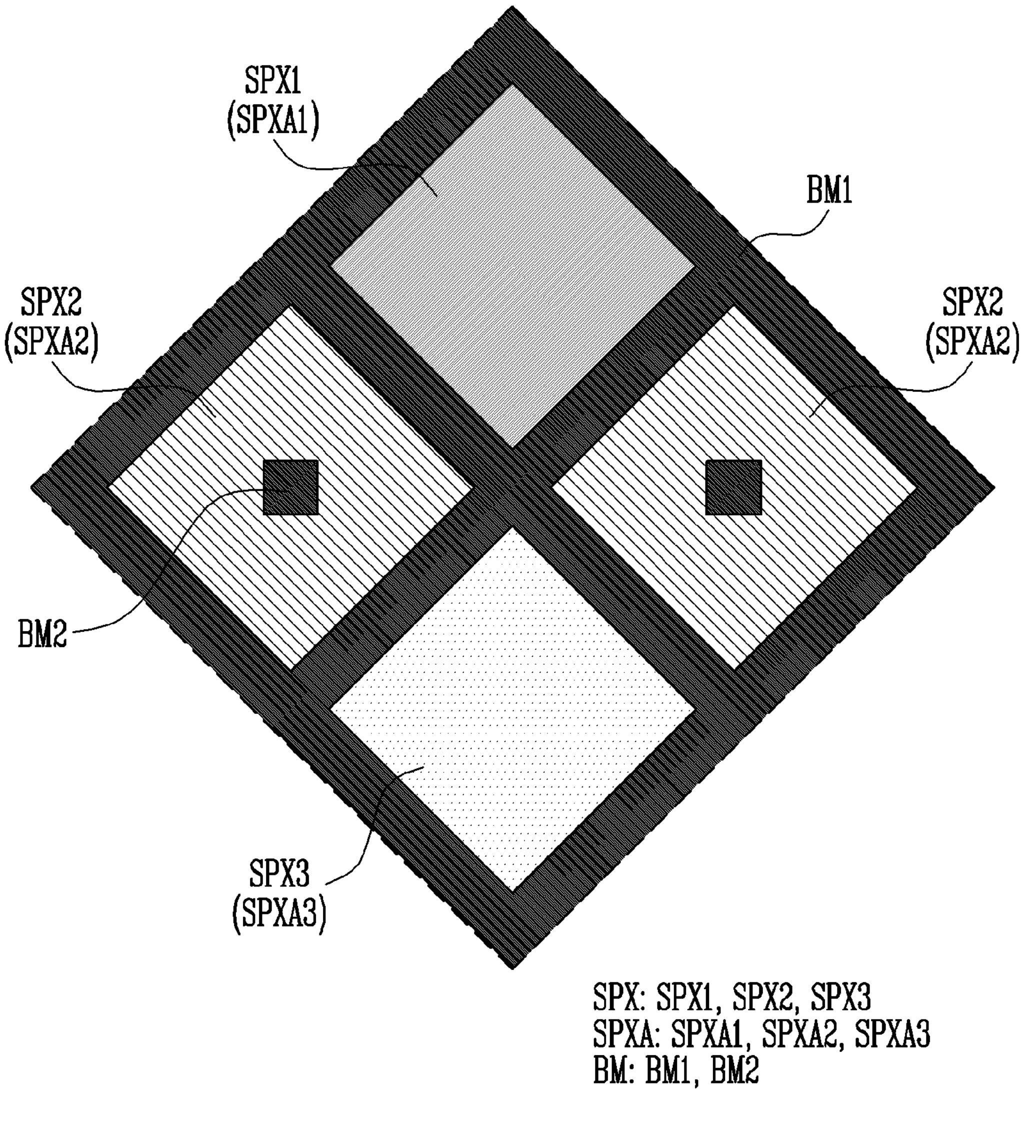
FIG. 12 is a schematic plan view illustrating a display device in accordance with a fourth embodiment.

FIG. 12 is a schematic plan view illustrating the display device DD in accordance with the fourth embodiment.

The display device DD in accordance with the fourth embodiment differs from the display device DD in accordance with the first embodiment in that the second light blocking members BM2 are selectively disposed in some of the sub-pixel areas SPXA.

In an embodiment, the second light blocking members BM2 may be disposed in sub-pixels SPX of some colors, and may not be disposed in sub-pixels SPX of the other colors. For example, the second light blocking member BM2 may be included in the second sub-pixel SPX2, which is a green sub-pixel, but it may not be included in either the first sub-pixel SPX1, which is a red sub-pixel, or in the third sub-pixel SPX3, which is a blue sub-pixel.

In an embodiment, the reflective electrode RL may be disposed in the second sub-pixel area SPXA2, but it may not be included in either the first sub-pixel area SPXA1 or the third sub-pixel area SPXA3.

According to the present embodiment, in a manner similar to the technical effects in accordance with the third embodiment, the second light blocking members BM2 are selectively disposed in some sub-pixels SPX so that luminance differences between the sub-pixels SPX may be compensated for. Accordingly, as described above, with the improvement in visibility, luminance differences between the sub-pixels SPX may be compensated for, whereby the color quality of the display device DD can be further improved.

Various embodiments of the present disclosure may provide a display device having improved visibility.

Various embodiments of the present disclosure may provide a display device which can be fabricated through simplified process steps, resulting in reduction in the process cost.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure is defined by the accompanying claims.

What is claimed is:

1. A display device, comprising sub-pixels forming respective sub-pixel areas, wherein each of the sub-pixels comprises:

a display part;

a sensor part disposed on the display part, and including a reflective electrode overlapping the sub-pixel areas; and an outer part disposed on the sensor part, and including a light blocking member overlapping the reflective electrode.

2. The display device according to claim 1, wherein the sensor part includes a first conductive pattern layer, a second conductive pattern layer, and an insulating layer disposed between the first conductive pattern layer and the second conductive pattern layer, and wherein the reflective electrode is formed of the second conductive pattern layer.

3. The display device according to claim 2, wherein the sensor part includes a sensing electrode formed of the second conductive pattern layer, and the sensing electrode and the reflective electrode include an identical material.

4. The display device according to claim 3, wherein the insulating layer and the reflective electrode contact each other.

5. The display device according to claim 1, wherein the display part comprises a base layer disposed on a planar surface, and a light emitting element disposed on the base layer and including an emission layer, wherein the light blocking member comprises a first light blocking member and a second light blocking member spaced apart from each other in a direction in which the planar surface extends, and wherein, in a plan view, the first light blocking member is disposed in an area between the sub-pixel areas, and the second light blocking member is disposed in the sub-pixel areas.

6. The display device according to claim 5, wherein a lower surface of the reflective electrode faces the emission layer, and an upper surface of the reflective electrode faces the second light blocking member.

7. The display device according to claim 6, wherein, in a plan view, the reflective electrode does not overlap the first light blocking member, and overlaps the second light blocking member.

8. The display device according to claim 7, wherein the display device further comprises a pixel defining layer formed to define an area where the emission layer is disposed, wherein the sensor part comprises a sensing electrode disposed on a same layer as the reflective electrode, wherein the reflective electrode and the second light blocking member overlap the emission layer, in a plan view, and wherein the sensing electrode and the first light blocking member overlap the pixel defining layer, in a plan view.

9. The display device according to claim 5, wherein the outer part further comprises a color filter configured to allow a color of light to selectively pass therethrough, and wherein the color filter contacts the reflective electrode.

10. The display device according to claim 9, wherein the color filter covers an overall upper surface of the reflective electrode.

11. The display device according to claim 9, wherein the second light blocking member is disposed on the color filter, and brought into contact with the color filter.

12. The display device according to claim 11, wherein the first light blocking member is brought into contact with the color filter, and spaced apart from the reflective electrode, in a plan view.

13. The display device according to claim 1, wherein the light blocking member includes a light absorbent material, wherein light provided from the display part includes first light and second light, the first light is emitted outward through an area where the reflective electrode is not disposed, and the second light is reflected by a lower surface of the reflective electrode, and reflected by at least some layers of the display part, and then emitted outward, and wherein external light introduced from an outside of the display device is reflected by an upper surface of the reflective electrode and absorbed by the light blocking member.

14. The display device according to claim 5, wherein the first light blocking member has a first light blocking width, wherein the second light blocking member has a second light blocking width, and wherein the second light blocking width is less than the first light blocking width.

15. The display device according to claim 14, wherein the reflective electrode has an electrode width, and wherein the electrode width is less than the second light blocking width.

16. The display device according to claim 1, wherein the light blocking member comprises a first light blocking member disposed between the sub-pixel areas, and a second light blocking member disposed in the sub-pixel areas, and wherein the second light blocking member comprises a plurality of components disposed in any one of the sub-pixel areas.

17. The display device according to claim 1, wherein the sub-pixel areas include a first sub-pixel area and a second sub-pixel area, wherein the light blocking member comprises a first light blocking member disposed between the first sub-pixel area and the second sub-pixel area, and a second light blocking member disposed in the first sub-pixel area and the second sub-pixel area, wherein the second light blocking member comprises a 2_1-th light blocking member disposed in the first sub-pixel area, and a 2_2-th light blocking member disposed in the second sub-pixel area, and wherein a width of the 2_2-th light blocking member is greater than a width of the 2_1-th light blocking member.

18. The display device according to claim 1, wherein the sub-pixel areas include a first sub-pixel area and a second sub-pixel area, wherein the light blocking member comprises a first light blocking member disposed between the first sub-pixel area and the second sub-pixel area, and a second light blocking member disposed in the second sub-pixel area, and wherein the second light blocking member is not disposed in the first sub-pixel area.

19. A display device, comprising:

a display part including sub-pixels;

a sensor part disposed on the display part, and including a first conductive pattern layer, a second conductive pattern layer, and an insulating layer disposed between the first conductive pattern layer and the second conductive pattern layer; and an outer part disposed on the sensor part, and including a color filter and a light blocking member, wherein the sub-pixels respectively form sub-pixel areas each providing a color of light, wherein the light blocking member comprises a first light blocking member disposed in the sub-pixel areas, and a second light blocking member disposed between the sub-pixel areas, wherein the second conductive pattern layer includes a reflective electrode overlapping the sub-pixel areas in a plan view, wherein the second light blocking member is disposed on one surface of the color filter and brought into contact with the color filter, and wherein the color filter covers an overall upper surface of the reflective electrode.

20. A display device, comprising:

a display part including sub-pixels;

a sensor part disposed on the display part, and including a first conductive pattern layer, a second conductive pattern layer, and an insulating layer disposed between the first conductive pattern layer and the second conductive pattern layer; and an outer part disposed on the sensor part, and including a color filter and a light blocking member, wherein the sub-pixels respectively form sub-pixel areas each providing a color of light, wherein the sub-pixel areas include a first sub-pixel area and a second sub-pixel area, wherein the light blocking member comprises a first light blocking member disposed between the sub-pixel areas, and a second light blocking member disposed in the second sub-pixel area, wherein the second light blocking member is not disposed in the first sub-pixel area, wherein the second conductive pattern layer includes a sensing electrode and a reflective electrode, and wherein the reflective electrode overlaps the second light blocking member in a plan view.

* * * * *